May 10, 1966 J. C. SCHMITT 3,251,007
CRYSTAL CONTROLLED OSCILLATOR HAVING OUTPUT FREQUENCIES OTHER THAN CRYSTAL FREQUENCY HARMONICS
Filed Oct. 9, 1963
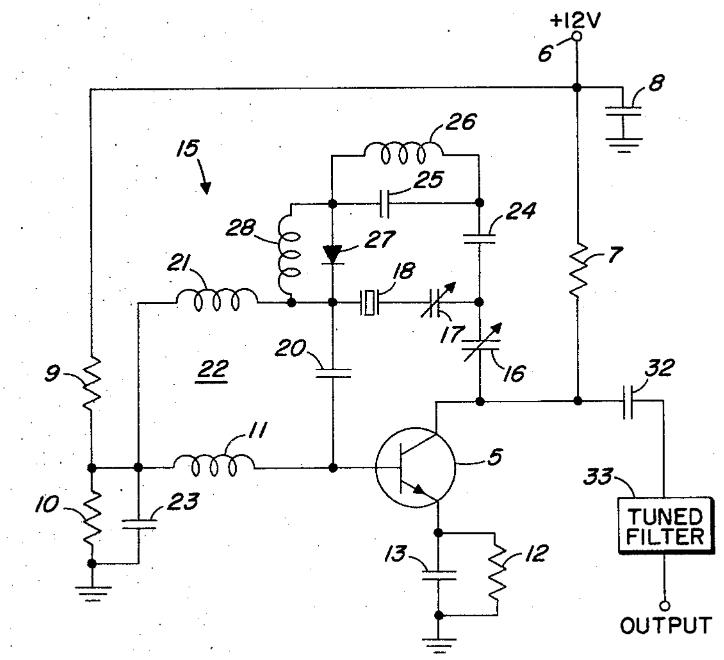
INVENTOR.
JERRY C. SCHMITT
BY Moody and Harris
ATTORNEYS 3,251,007
Patented May 10, 1966

3,251,007

CRYSTAL CONTROLLED OSCILLATOR HAVING OUTPUT FREQUENCIES OTHER THAN CRYSTAL FREQUENCY HARMONICS

Jerry C. Schmitt, Marion, Iowa, assignor to Collins Radio Company, Cedar Rapids, Iowa, a corporation of Iowa Filed Oct. 9, 1963, Ser. No. 315,045
6 Claims. (Cl. 331—116)

This invention relates to a crystal controlled oscillator and more particularly to a crystal controlled oscillator capable of producing an output signal the frequency of which may be other than the crystal frequency or a harmonic thereof.

Because of the inherent ability of the crystal controlled oscillator, it has found wide usage in the electronics art. Use of known crystal controlled oscillators is limited, however, to use where the desired frequency of the output signal is either that of the crystal frequency or a harmonic thereof. In the past this has necessitated the use of a plurality of crystals or, in some cases, the use of another type of oscillator to achieve the desired output frequency. For example, if a 100 kilocycle signal is desired, either a 100 kilocycle crystal or the fourth harmonic of a 25 kilocycle crystal could be easily utilized. However, if a 1025 kilocycle signal is desired, the 100 kilocycle crystal could not be used in existing systems and use of a 25 kilocycle crystal would mean that the forty-first harmonic would be needed.

It is an object of this invention to provide a crystal controlled oscillator that has an output frequency that is not limited to the crystal frequency or to a harmonic thereof.

More particularly, it is an object of this invention to provide a crystal controlled oscillator having the stability inherently found in such an oscillator but yet capable of producing an output frequency that is not limited to the crystal frequency or a harmonic thereof.

It is another object of this invention to provide a crystal controlled oscillator having dual oscillation circuits whereby the output signal produced is not limited to the crystal frequency or a harmonic thereof.

It is another object of this invention to provide a crystal controlled oscillator wherein the feedback circuitry includes a crystal connected between the output and input electrodes of an electron control device and reactance elements connected in parallel with said crystal in a manner such that said oscillator is capable of producing an output signal having a frequency other than the frequency of the crystal or a harmonic thereof.

With these and other objects in view which will become apparent to one skilled in the art as the description proceeds, this invention resides in the novel construction, combination and arrangement of parts substantially as hereinafter described and more particularly defined by the appended claims, it being understood that such changes in the precise embodiment of the herein disclosed invention may be included as come within the scope of the claims.

The accompanying drawing illustrates one complete example of the embodiment of the invention constructed according to the best mode so far devised for the practical application of the principles thereof, and in which the single figure shown is a partial schematic presentation of the oscillator circuit of this invention.

Referring now to the drawing, the numeral 5 indicates an amplifying device, shown in the schematic presentation as a transistor. Operating voltages for transistor 5 are supplied to terminal 6 by means of a power supply (not shown) supplying a positive D.-C. voltage, for example, 12 volts. The positive D.-C. voltage at terminal 6 is coupled through resistor 7 to the collector of transistor 5, and a bypass capacitor 8 to ground is connected between terminal 6 and resistor 7. In addition, a voltage divider consisting of serially connected resistors 9 and 10 is also connected between terminal 6 and ground, and the junction of resistors 9 and 10 is connected through inductor 11 to the base of transistor 5. The emitter of transistor 5 is connected to ground through resistor 12, which resistor has a bypass capacitor 13 connected in parallel therewith.

The feedback circuitry necessary for oscillaton is indicated generally by the numeral 15. As shown in the drawings, the feedback path is from the collector of transistor 5 back to the base. The collector of transistor 5 is connected to one side of a variable capacitor 16, the other side of which is connected through variable capacitor 17 to one side of crystal 18. The other side of crystal 18 is connected to one side of capacitor 20 and one side of inductor 21. The other side of inductor 21 and the other side of capacitor 20, are, in turn, connected to opposite sides of inductor 11. Inductors 11 and 21 are thus connected in series across capacitor 20 (to form a 180° phase shift network 22 at the crystal frequency) and the junction of inductor 11 and capacitor 20 is connected to the base of transistor 5. In addition, a bypass capacitor 23 to ground is connected to the common junction of resistors 9 and 10 and inductors 11 and 21.

The junction of variable capacitors 16 and 17 is also connected to one side of capacitor 24, the other side of which capacitor is connected to one side of capacitor 25 and one side of inductor 26. Capacitor 25 and inductor 26 are connected in parallel with the other side of each being connected to the anode of diode 27. Inductor 26 and capacitor 25 therefore form a tank circuit which is in parallel with crystal 18. Capacitors 16 and 24 are in series with the tank so that a series-parallel network is formed. Capacitor 16 is used to adjust the frequency of the series-parallel network. The cathode or diode 27 is connected to the junction of crystal 18, capacitor 20 and inductor 21. In addition, diode 27 has an inductor 28 connected in parallel therewith, the purpose of which is to remove the D.-C. from diode 27.

The output from the oscillator is taken from the collector electrode of transistor 5 through coupling capacitor 32 to tuned filter 33. Tuned filter 33 is tuned to a predetermined desired output frequency and, since a plurality of possible frequency combinations are present at the collector of transistor 5, a plurality of tuned filters could be utilized to couple a plurality of frequency outputs from the oscillator.

It is believed that the theory of operation involves dual oscillation. This is provided by dual feedback paths present in feedback circuitry 15. The first feedback path includes capacitor 16, capacitor 17, crystal 18, capacitor 20 and inductors 11 and 21. This feedback path causes oscillation at the crystal frequency and thus causes an oscillation output at the crystal frequency and harmonics thereof. Minor frequency adjustments can be made in the crystal feedback circuit by use of capacitor 17.

As shown in the drawing, a second oscillation circuit is provided by a feedback circuit that includes capacitors 16, 24 and 25 and inductor 26, these reactance elements being coupled through diode 27 (having the shunt coil 28 connected in parallel therewith) and network 22 (of the first oscillator circuitry) to the base electrode of transistor 5. The frequency of this path is adjusted by use of capacitor 16. Diode 27 provides isolation between the two feedback paths so that both feedback paths can oscillate.

Assuming, for example, that the crystal frequency is 100 kilocycles and the second oscillator frequency is 75 kilocycles, a phase lock occurs periodically and the sum or the difference between the 100 kilocycle signal (or any harmonic thereof) and the 75 kilocycle signal (or any harmonic thereof) can be derived at the output. The resulting output signal can therefore be other than an integer harmonic of the crystal oscillator frequency and yet can still be crystal controlled.

As a specific example and assuming that the crystal oscillator frequency is 100 kilocycles while the second oscillating frequency is 125 kilocycles, 1025 kilocycles can be readily obtained by using the ninth harmonic of the 100 kilocycle crystal frequency plus the fundamental of the 125 kilocycle second oscillating frequency, or with the ninth harmonic of the 125 kilocycle second oscillating frequency less the fundamental of the 100 kilocycle crystal oscillating frequency. This is far superior to a system which requires a straight harmonic of the crystal frequency such as, for example, utilizing the forty-first harmonic of a 25 kilocycle crystal.

It can thus be seen that the output of this oscillator is not limited to an integer harmonic of the crystal frequency but yet is controlled by the crystal frequency to therefore provide the stability inherent in crystal oscillators. The output produced can have the sum and difference frequencies of all the harmonics of the crystal frequency and the major output frequency because the output signal contains some portion of both the dual oscillation frequencies.

A working embodiment of the oscillator of this invention has been constructed and the components are listed hereinbelow. It is to be realized, however, that this invention is not meant to be limited to the particular components listed herein. The components are as follows:

| Numeral | Component | Value or Designation |
|---|---|---|
| 5 | Transistor | 2N1613. |
| 7 | Resistor | 1K Ohms. |
| 8 | Capacitor | 1 Microfarad. |
| 9 | Resistor | 10K Ohms. |
| 10 | do | 1.8K Ohms. |
| 11 | Inductor | 220 Microhenrys. |
| 12 | Resistor | 140 Ohms. |
| 13 | Capacitor | 1 Microfarad. |
| 16 | Variable Capacitor | 58–100 Picofarads. |
| 17 | do | 8–50 Picofarads. |
| 18 | Crystal | 100 kc. (Par. Res.). |
| 20 | Capacitor | 5,600 Picofarads. |
| 21 | Inductor | 220 Microhenrys. |
| 23 | Capacitor | 0.33 Microfarad. |
| 24 | do | 600 Picofarads. |
| 25 | do | 900 Picofarads. |
| 26 | Inductor | 50 Millihenrys. |
| 27 | Diode | 1N92. |
| 28 | Inductor | 2.5 Millihenrys. |
| 32 | Capacitor | 27 Picofarads. |

From the foregoing, it should be obvious to those skilled in the art that this invention provides a novel crystal controlled oscillator that is capable of providing an output frequency other than the crystal frequency or harmonic thereof but yet has the stability inherently found in a crystal controlled oscillator.

What is claimed as my invention is:

1. A crystal controlled oscillator comprising: an amplifying device; means providing operating voltages for said amplifying device; and a regenerative feedback system connected to said amplifying device including inductive and capacitive reactance elements, at least one of said reactance elements being adjustable, a diode, and a crystal, said crystal and said reactance elements being connected in parallel with one another through said diode so that said diode isolates said parallel paths whereby said oscillator is capable of producing an output signal having a frequency other than the crystal frequency or integral harmonic thereof.

2. The oscillator of claim 1 wherein said reactance elements form an adjustable frequency series-parallel resonance circuit the frequency of which is different from the frequency of said crystal.

3. A crystal oscillator capable of producing an output frequency other than the crystal frequency or integer harmonic thereof, said oscillator comprising: an amplifying device; first feedback means connected to said amplifying device, said first feedback means including a crystal and causing oscillation at said crystal frequency; second feedback means also connected to said amplifying device, said second feedback means causing oscillation at a predetermined second frequency; a diode connected between said first and second feedback means to isolate said feedback means from one another; and output means connected to the output of said amplifying device for coupling an output signal from said oscillator, said output signal including said crystal and second frequencies and harmonics of each, as well as sum and difference combinations thereof.

4. The oscillator of claim 3 further characterized by a tuned filter connected to said output means whereby a predetermined frequency other than an integral multiple of said crystal frequency may be selected.

5. A crystal controlled oscillator comprising: an amplifying device; first amplifier feedback means including a crystal and a 180° phase shift network, said first amplifier feedback means causing oscillation at the frequency of said crystal; second amplifier feedback means including a tank circuit and said 180° phase shift network, said second amplifier feedback means causing oscillation at a second frequency; a diode for connecting said second amplifier feedback means to said first amplifier feedback means for isolating said first and second feedback means; and tuned filter means for coupling an output signal from said oscillator at a predetermined frequency not limited to an integer harmonic of said crystal frequency.

6. A crystal oscillator capable of producing an output signal having a frequency other than the crystal frequency or an integer harmonic thereof, said oscillator comprising: a transistor having emitter, base, and collector electrodes; means for providing operating voltages to the electrodes of said transistor; a first feedback network including a crystal, capacitor means connected between the collector of said transistor and one side of said crystal, and 180° phase shift means connected between the base of said transistor and to the other side of said crystal, said first feedback network causing oscillation at the crystal frequency; a second feedback network including a tank circuit resonant at a frequency other than said crystal frequency, a diode connecting said tank circuit in parallel with said crystal, and an inductor connected in parallel with said diode, said second feedback network causing oscillation at a second frequency; and output means for coupling said output signal from said collector of said transistor.

References Cited by the Examiner

UNITED STATES PATENTS

| | | | |
|---|---|---|---|
| 2,741,700 | 4/1956 | Hall | 331—158 |
| 2,820,144 | 1/1958 | Hermes | 331—164 |
| 3,137,826 | 6/1964 | Boudrias | 331—116 |

ROY LAKE, *Primary Examiner.*

S. H. GRIMM, *Assistant Examiner.*